United States Patent
Pele et al.

(10) Patent No.: US 11,838,032 B1
(45) Date of Patent: Dec. 5, 2023

(54) ADVANCED ULTRA LOW POWER ERROR CORRECTING CODE ENCODERS AND DECODERS

(71) Applicant: Western Digital Technologies, Inc., San Jose, CA (US)

(72) Inventors: Ofir Pele, Hod HaSharon (IL); Stella Achtenberg, Netanya (IL); Ran Zamir, Ramat Gan (IL); Omer Fainzilber, Kfar-Saba (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/968,249

(22) Filed: Oct. 18, 2022

(51) Int. Cl.
| | |
|---|---|
| H03M 13/01 | (2006.01) |
| H03M 13/39 | (2006.01) |
| H03M 13/11 | (2006.01) |
| H03M 13/15 | (2006.01) |

(52) U.S. Cl.
CPC ..... *H03M 13/015* (2013.01); *H03M 13/3911* (2013.01); *H03M 13/1177* (2013.01); *H03M 13/1575* (2013.01); *H03M 13/3916* (2013.01)

(58) Field of Classification Search
CPC .......... H03M 13/015; H03M 13/3911
See application file for complete search history.

(56) References Cited

U.S. PATENT DOCUMENTS

2018/0205398 A1* 7/2018 Shany ............... H03M 13/153

OTHER PUBLICATIONS

Paulo Ricardo Branco da Silva and Danilo Silva; Multilevel LDPC Lattices with Efficient Encoding and Decoding and a Generalization of Construction D'; IEEE Transactions on Information Theory; Nov. 22, 2018 (Year: 2018).*

* cited by examiner

*Primary Examiner* — Joseph D Torres
(74) *Attorney, Agent, or Firm* — Armstrong Teasdale LLP (57) ABSTRACT

Advanced ultra-low power error correcting codes are generated using soft quantization and lattice interpolation based on clock and Syndrome Weight. Reinforcement learning may be used to generate threshold values for flipping bits for low density parity check Ultra-Low Power error correction codes. The threshold values can be generated offline and downloaded to a storage device or generated while the storage device is in use.

20 Claims, 5 Drawing Sheets

ADVANCED ULTRA LOW POWER ERROR CORRECTING CODE ENCODERS AND DECODERS

BACKGROUND

The Ultra-Low Power (ULP) ECC (error correction code) decoder is a fast and efficient ECC engine that improves the LDPC (low density parity check) scheme when compared to various other ECC schemes. Accordingly, ULP ECC is widely used by various data storage devices.

The ULP ECC scheme is iterative. Its convergence time is not deterministic and depends on the bit error rate (BER) and the underlying LDPC code (generator graph). In current ULP decoders, a table that contains threshold values per clock is pre-calculated off-line and is provided to the storage controller. The table is used in the decoding scheme. For each variable bit, the number of unsatisfied equations (sum of check node values connected to the bit) is calculated and a decision is made whether to flip the bit value or not according to the threshold.

However, the threshold values in the table can be suboptimal due to circles that exist in the generator graph and due to neglecting the temporary Syndrome Weight (SW, the sum of all check nodes) when the table thresholds are pre-calculated. Accordingly, there is a need to generate optimal, or closer to optimal thresholds for the ULP LDPC decoder.

SUMMARY

The present application relates generally to error correction code, and more specifically, to advanced ultra-low power error correcting codes. More particularly, the systems and methods described herein disclose using soft quantization and lattice interpolation based, at least in part, on clock and Syndrome Weight with reinforcement learning to generate thresholds for flipping bits for a ULP LDPC decoder.

Accordingly, the present application describes a method for generating a plurality of threshold values used by an Ultra-Low Power (ULP) Low Density Parity Check (LDPC) decoder. In an example, this includes conducting a plurality of simulations for decoding stored data. For each simulation of the plurality of simulations, a Syndrome Weight (SW) for a current pass of the simulation is determined, lattice interpolations for a plurality of SW values on a subset of lattice points of a plurality of lattice points is performed in which the subset of lattice points are adjacent to the SW for the current pass of the simulation, and a plurality of threshold values for the plurality of lattice points are generated based, at least in part, on a plurality of distances between the subset of lattice points and the SW for the current pass of the simulation. A table of the plurality of threshold values may then be stored.

The present application also describes a storage device that includes a non-volatile memory device including a plurality of memory cells and a controller communicatively coupled to the non-volatile memory device. The controller includes an Ultra-Low Power (ULP) Low Density Parity Check (LDPC) decoder and is configured to decode data stored in the plurality of memory cells. Based on determining that the data stored in the plurality of memory cells includes an error, the controller performs error correction code (ECC) decoding on the data using a table of threshold values. In an example, the table of threshold values identifies which data bits and corresponding error code bits of the data stored in the plurality of memory cells to flip. The table of threshold values is generated, based at least in part, on a plurality of distances between a subset of lattice points of a plurality of lattice points and a determined Syndrome Weight (SW) associated with a pass of a simulation of a plurality of simulations in which sample data was decoded and determined lattice interpolations for a plurality of SW values on the subset of lattice points of the plurality of lattice points associated with the pass of the simulation of the plurality of simulations in which the sample data was decoded.

Also described is a method for generating a plurality of threshold values used by an Ultra-Low Power (ULP) Low Density Parity Check (LDPC) decoder. In an example, the method includes conducting a plurality of simulations using reinforcement learning to train a model for decoding stored data. For each simulation of the plurality of simulations a Syndrome Weight (SW) for a current pass of the simulation is determined, lattice interpolations for a plurality of SW values on a subset of lattice points adjacent to the SW for the current pass of the simulation is performed, and a plurality of threshold values for a plurality of lattice points are generated based, at least in part, on a plurality of distances between the subset of lattice points and the SW for the current pass of the simulation. A table of the plurality of threshold values is stored and the model is updated using the plurality of threshold values.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

The present application relates generally to error correction code, and more specifically, to advanced ultra-low power error correcting codes. More particularly, the systems and methods described herein recite using soft quantization and lattice interpolation with reinforcement learning to generate thresholds used by a LDPC decoder to determine whether and which bits of stored data to flip when performing error correction.

For example, when data is written to memory, there is the potential for errors to occur. This is especially true when writing to flash memory. However, it is time and power intensive to double-check each bit and compare it to the original. Accordingly, error correcting codes (ECC) may be used to detect and fix those errors. In some examples, this comprises generating redundant bit codes that encode the XOR of multiple different bits into an error code bit. In many situations, the multiple different bits for each error code bit are non-consecutive. The multiple different bits for the error code bit are chosen so that when XORed together, they result in a zero. Each bit is XORed in more than one error code bit to assist with identifying errors. If a bit is tied to two error code bits that are both is, this is an indicator that the individual bit may be incorrect.

Accordingly, the system takes into account the number of XOR equations the bit has not satisfied. The more XOR equations the bit does not satisfy, the higher the likelihood that the bit is in error. The question becomes how many XOR equations need to be unsatisfied for the system to flip the bit? When the bit is flipped, all of the XOR equations associated with the flipped bit have their error code bits flipped as well. The number of unsatisfied XOR equations depends on the number of XOR equations connected to that bit, the number of times that the system has visited this bit in the process, and the Syndrome Weight, which is the total number of unsatisfied XOR equations in the stored data being checked.

In many cases, density evolution is used to generate a table of thresholds to find the threshold number of unsatisfied XOR equations to instruct the system to flip a particular bit. However, density evolution requires that the graph being analyzed does not contain cycles. That is, density evolution assumes that the graph is a tree. However many storage solutions that use graphs are not trees and thus have problems using density evolution.

In order to address the above, a reinforcement learning process can be used to find appropriate and more optimal thresholds. Furthermore, the use of reinforcement learning also allows for faster decoding when compared with conventional ULP LDPC decoders.

Reinforcement learning (RL) is an area of machine learning concerned with how intelligent agents take actions in an environment in order to maximize the notion of cumulative reward. RL is one of three basic machine learning paradigms, alongside supervised learning, and unsupervised learning.

RL differs from supervised learning in not needing labelled input/output pairs to be presented, and in not needing sub-optimal actions to be explicitly corrected. Instead, the focus is on finding a balance between exploration (of uncharted territory) and exploitation (of current knowledge). Partially supervised RL algorithms can combine the advantages of supervised learning and RL algorithms.

The environment is typically stated in the form of a Markov decision process (MDP) because many reinforcement learning algorithms for this context use dynamic programming techniques. The main difference between the classical dynamic programming methods and reinforcement learning algorithms is that the latter do not assume knowledge of an exact mathematical model of the MDP and they target large MDPs where exact methods become infeasible.

RL trains an agent in an environment. The agent takes an action and the environment returns rewards and observations about the current state of the environment. Basic RL is modeled as a Markov decision process (MDP), which includes: a set of environment and agent states, S; a set of actions, A, of the agent; $P_a(s, s')=Pr(s_{t+1}=s'|s_t=s, a_t=a)$ is the probability of transition (at time t) from state s to state s' under action a; and $R_a(s, s')$ is the immediate reward after transition from s to s' with action a.

The purpose of RL is for the agent to learn an optimal, or nearly-optimal, policy that maximizes a "reward function" or other user-provided reinforcement signal that accumulates from the immediate rewards. A basic RL agent AI interacts with its environment in discrete time steps. At each time t, the agent receives the current state st and reward rt. It then chooses an action at from the set of available actions, which is subsequently sent to the environment. The environment moves to a new state st+1 and the reward rt+1 associated when the transition (st, at, st+1) is determined. The goal of a RL agent is to learn a policy: $\pi: A \times S \rightarrow [0,1]$, $\pi(a, s)=Pr(a_t|s_t=s)$ which maximizes the expected cumulative reward.

Formulating the problem as an MDP assumes the agent directly observes the current environmental state; in this case the problem is said to have full observability. When the agent's performance is compared to that of an agent that acts optimally, the difference in performance gives rise to the notion of regret. In order to act near optimally, the agent must reason about the long-term consequences of its actions (i.e., maximize future income), although the immediate reward associated with this might be negative.

Two elements make RL powerful: the use of samples to optimize performance and the use of function approximation to deal with large environments. Thanks to these two key components, RL can be used in large environments in the following situations: a model of the environment is known, but an analytic solution is not available; only a simulation model of the environment is given (the subject of simulation-based optimization); and the only way to collect information about the environment is to interact with it.

The first two of these problems could be considered planning problems (since some form of model is available), while the last one could be considered to be a genuine learning problem. However, RL converts both planning problems to machine learning problems.

Figure 1:
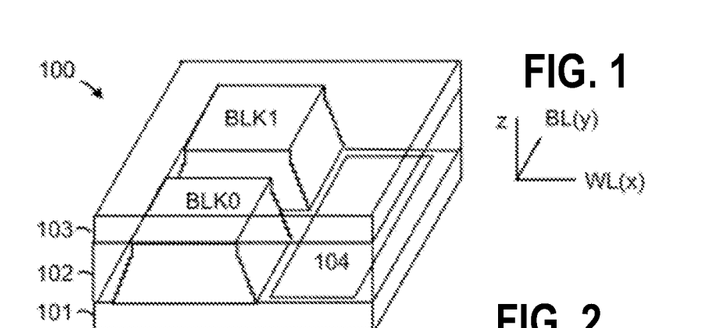
FIG. 1 is a perspective view of a storage system that includes three-dimensional (3D) stacked non-volatile memory.
Figure 2:
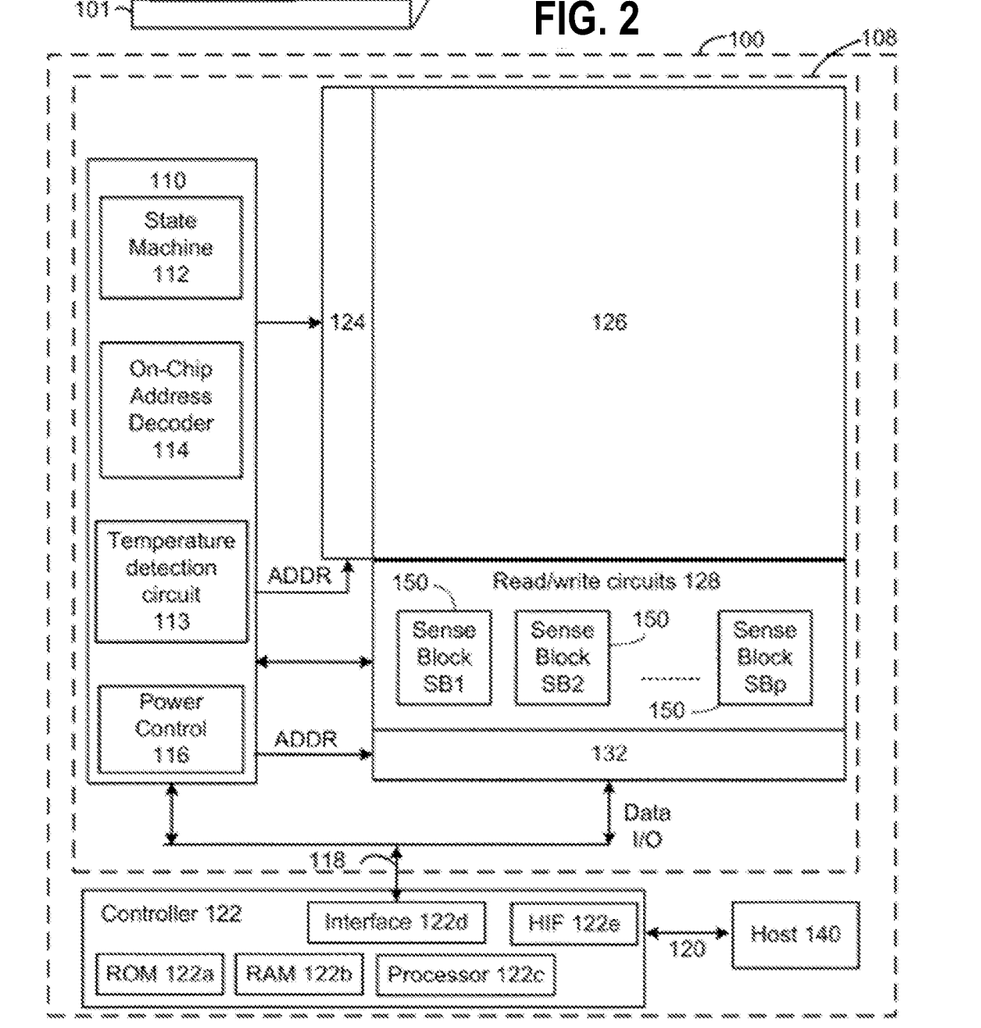
FIG. 2 is a functional block diagram of an example storage device, such as the 3D stacked non-volatile storage device of FIG. 1.
Figure 3:
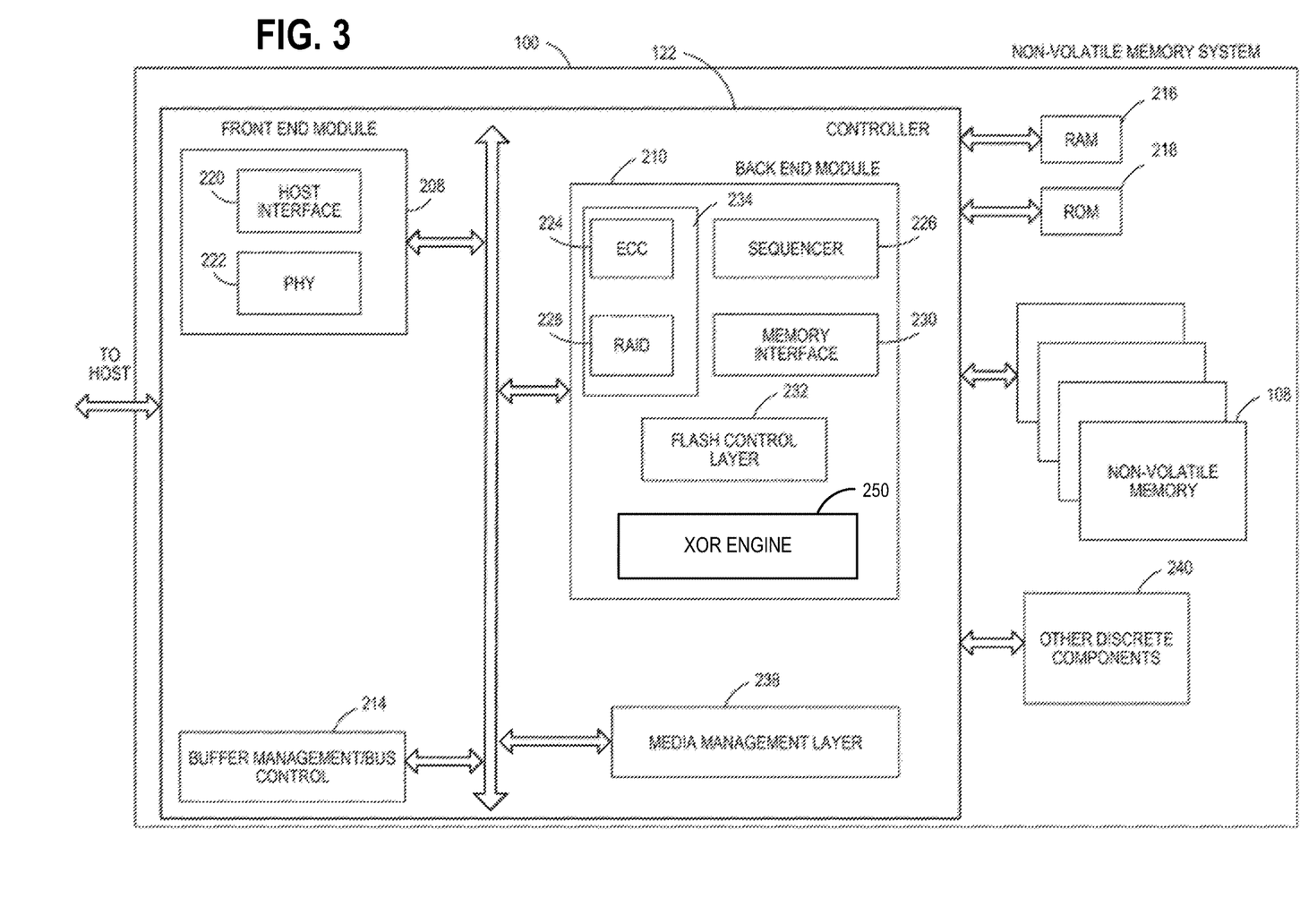
FIG. 3 is a block diagram of an example storage system, depicting more details of a controller of the storage system.

FIGS. 1-3 describe one example of a storage system that can be used to implement the technology disclosed herein. FIG. 1 is a perspective view of a storage system that includes three-dimensional (3D) stacked non-volatile memory. The storage device 100 includes a substrate 101. On and above the substrate are example blocks of memory cells, including BLK0 and BLK1, formed of memory cells (non-volatile memory elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the storage device 100. In an upper region 103 of the storage device 100, one or more upper metal layers are patterned in conductive paths to carry signals of the circuits. Each block of memory cells includes a stacked area of memory cells, where alternating levels of the stack represent word lines. While two blocks are depicted as an example, additional blocks can be used, extending in the x- and/or y-directions.

In one example implementation, the length of the plane in the x-direction represents a direction in which signal paths for word lines extend (e.g., a word line or drain-end select gate (SGD) line direction) and the width of the plane in the y-direction represents a direction in which signal paths for bit lines extend (e.g., a bit line direction). The z-direction represents a height of the storage device 100.

FIG. 2 is a functional block diagram of an example storage device, such as the 3D stacked non-volatile storage device 100 of FIG. 1. The components depicted in FIG. 2 are electrical circuits. Storage device 100 includes one or more memory dies 108. Each memory die 108 includes a three-dimensional memory structure 126 of memory cells (e.g., a 3D array of memory cells), control circuitry 110, and read/write circuits 128. In other examples, a two-dimensional array of memory cells can be used. Memory structure 126 is addressable by word lines via a decoder 124 (e.g., row decoder) and by bit lines via a column decoder 132. The read/write circuits 128 include multiple sense blocks 150 including SB1, SB2, . . . , SBp (e.g., sensing circuitry) and allow a page of memory cells to be read or programmed in parallel. In some systems, a controller 122 is included in the same storage device 100 (e.g., a removable storage card) as the one or more memory dies 108. However, in other systems, the controller can be separated from the memory die 108. In some examples, the controller may be on a different die than the memory die. In some examples, one controller 122 may communicate with multiple memory dies 108. In other examples, each memory die 108 has its own controller. Commands and data are transferred between the host 140 and controller 122 via a data bus 120, and between controller 122 and one or more of the memory dies 108 via lines 118. In one example, memory die 108 includes a set of input and/or output (I/O) pins that connect to lines 118.

Memory structure 126 may include one or more arrays of memory cells, including a 3D array. The memory structure may include a monolithic 3D memory structure in which multiple memory levels are formed above (e.g., and not in) a single substrate, such as a wafer, with no intervening substrates. The memory structure may include any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one example, state machine 112 is programmable by the software. In other examples, state machine 112 does not use software and is completely implemented in hardware (e.g., electrical circuits). In one example, control circuitry 110 includes registers, ROM fuses, and other devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers in a 3D configuration, select transistors (e.g., SGS and SGD transistors) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and controller 122 can be considered one or more control circuits, or a managing circuit, that performs some or all of the functions described herein.

Controller 122, which in one example is an electrical circuit that may be on-chip or off-chip, may include one or more processors 122c, ROM 122a, RAM 122b, memory interface 122d, and host interface 122e, all of which are interconnected. One or more processors 122c is one example of a control circuit. Other examples can use state machines or other custom circuits designed to perform one or more functions. Devices such as ROM 122a and RAM 122b may include code such as a set of instructions, and the processor 122c may be operable to execute the set of instructions to provide some or all of the functionality described herein. Alternatively or additionally, processor 122c may access code from a memory device in the memory structure, such as a reserved area of memory cells connected to one or more word lines. Memory interface 122d, in communication with ROM 122a, RAM 122b, and processor 122c, is an electrical circuit that provides an electrical interface between controller 122 and memory die 108. For example, memory interface 122d can change the format or timing of signals, provide a buffer, isolate from surges, latch I/O, and so forth. Processor 122c may issues commands to control circuitry 110, or any other component of memory die 108, via memory interface 122d. Host interface 122e, in communication with ROM 122a, RAM 122b, and processor 122c, is an electrical circuit that provides an electrical interface between controller 122 and host 140. For example, host interface 122e can change the format or timing of signals, provide a buffer, isolate from surges, latch I/O, and so forth. Commands and data from host 140 are received by controller 122 via host interface 122e. Data sent to host 140 are transmitted via host interface 122e.

Multiple memory elements in memory structure 126 may be configured so that they are connected in series or so that each element is individually accessible. By way of non-limiting example, flash memory devices in a NAND configuration (e.g., NAND flash memory) typically contain memory elements connected in series. A NAND string is an example of a set of series-connected memory cells and select gate transistors.

A NAND flash memory array may be configured so that the array includes multiple NAND strings, where a NAND string includes multiple memory cells sharing a single bit line and that are accessed as a group. Alternatively, memory elements may be configured so that each element is individually accessible (e.g., a NOR memory array). NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

Some three-dimensional memory arrays are arranged so that memory cells occupy multiple planes or multiple memory device levels, thereby forming a structure in three dimensions (e.g., in the x, y, and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, such as in the y direction) with each column having multiple memory cells. The vertical columns may be arranged in a two-dimensional arrangement of memory cells, with memory cells on multiple vertically stacked memory planes. Other configurations of memory elements in three dimensions can also constitute a 3D memory array.

By way of non-limiting example, in a 3D NAND memory array, the memory elements may be coupled together to form vertical NAND strings that traverse across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a block diagram of example storage system 100, depicting more details of controller 122. In one example, the system of FIG. 3 is a solid-state drive (SSD). As used herein, a flash memory controller is a device that manages data stored on flash memory and communicates with a host, such as a computer or other electronic device. A flash memory controller may have various functionalities in addition to the specific functionalities described herein. For example, the flash memory controller may format the flash memory to ensure the memory is operating properly, map out bad flash memory cells, and allocate spare memory cells to be substituted for future failed memory cells. Some part of the spare memory cells can be used to hold firmware to operate the flash memory controller and implement other features. During operation, when a host reads data from or writes data to the flash memory, the host will communicate with the flash memory controller. If the host provides a logical address to which data is to be read/written, the flash memory controller may convert the logical address received from the host to a physical address in the flash memory. Alternatively, in some examples, the host may provide the physical address. The flash memory controller may also perform various memory management functions such as, but not limited to, wear leveling (e.g., distributing writes to avoid wearing out specific blocks of memory that may otherwise be repeatedly written to) and garbage collection (e.g., after a block is full, moving only the valid pages of data to a new block, so the full block can be erased and reused). Non-volatile memories other than flash may have non-volatile memory controllers that are similar to flash memory controllers.

The communications interface between controller 122 and non-volatile memory dies 108 may be any suitable flash interface, such as toggle mode. In one example, storage subsystem 100 may be a card-based system, such as a secure digital (SD) or a micro secure digital (micro-SD) card. In another example, storage system 100 may be part of an embedded storage system. For example, the flash memory may be embedded within the host, such as in the form of a solid-state disk drive installed in a personal computer.

In some examples, storage system 100 includes a single channel between controller 122 and non-volatile memory dies 108. However, the subject matter described herein is not limited to having a single memory channel. For example, in some storage system architectures, two, four, eight, or more channels may exist between the controller and the memory dies 108 (e.g., depending on controller capabilities). In any of the examples described herein, more than a single channel may exist between the controller and the memory dies 108, even if a single channel is shown in the drawings.

As depicted in FIG. 3, controller 122 includes a front-end module 208 that interfaces with a host, a back-end module 210 that interfaces with the one or more non-volatile memory dies 108, and various other modules that perform functions which are described herein.

The components of controller 122 depicted in FIG. 3 may take the form of a packaged functional hardware unit (e.g., an electrical circuit) designed for use with other components, a portion of a program code (e.g., software or firmware) executable by a processor or processing circuitry (e.g., one or more processors) that usually performs a particular function or related functions, or a self-contained hardware or software component that interfaces with a larger system. For example, each module may include an application-specific integrated circuit (ASIC), a field programmable gate array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program one or more processors for controller 122 to perform the functions described herein. The architecture depicted in FIG. 3 is one example implementation that may or may not use the components of controller 122 depicted in FIG. 2 (e.g., RAM, ROM, processor, interface).

Referring again to modules of the controller 122, a buffer manager/bus controller 214 manages buffers in random access memory (RAM) 216 and controls the internal bus arbitration of controller 122. A read-only memory (ROM) 218 stores system boot code. Although illustrated in FIG. 3 as located separately from the controller 122, in other examples, one or both of the RAM 216 and ROM 218 may be located both within the controller 122 and outside the controller 122. Further, in some implementations, the controller 122, RAM 216, and ROM 218 may be located on separate semiconductor dies.

Front-end module 208 includes a host interface 220 and a physical layer interface 222 (PHY) that provide the electrical interface with the host or next level storage controller. The choice of the type of host interface 220 can depend on the type of memory being used. Examples of host interfaces 220 include, for example, SATA, SATA Express, SAS, Fibre Channel, USB, PCIe, and NVMe. The host interface 220 may be a communication interface that facilitates transfer for data, control signals, and timing signals.

Back-end module 210 includes an error correction controller (ECC) engine 224 that encodes the data bytes received from the host and decodes and error corrects the data bytes read from the non-volatile memory. A command sequencer 226 generates command sequences, such as program and erase command sequences, to be transmitted to non-volatile memory dies 108. A RAID (redundant array of independent dies) module 228 manages generation of RAID parity and recovery of failed data. The RAID parity may be used as an additional level of integrity protection for the data being written into the storage system 100. In some cases, the RAID module 228 may be a part of the ECC engine 224. Note that the RAID parity may be added as an extra die or dies, or may be added within existing dies (e.g., as extra plane(s), extra block(s), or extra WL(s) within block(s). ECC engine 224 and RAID module 228 may calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory dies 108. In some examples, memory interface 230 may be a double data rate (DDR) interface. A flash control layer 232 controls the overall operation of back-end module 210.

Back-end module 210 also includes an XOR engine 250. The XOR engine 250 performs many of the various parity protection methods for managing the non-volatile memory 108 as shown and described below with respect to FIGS. 4A-5.

Additional components of storage system 100 illustrated in FIG. 3 include media management layer 238, which performs wear leveling of memory cells of non-volatile memory dies 108. Storage system 100 also includes other discrete components 240, such as external electrical interfaces, external RAM, resistors, capacitors, or other components that may interface with controller 122. In other examples, one or more of the physical layer interface 222, media management layer 238, and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the storage device firmware which translates writes from the host into writes to the flash memory structure 126 of memory dies 108. The MML 238 may be used because, for example, the flash memory may have limited endurance, the flash memory structure 126 may only be written in multiples of pages, or the flash memory structure 126 may not be written unless it is erased as a block (e.g., a block may be considered to be a minimum unit of erase and such a non-volatile memory may be considered a block-erasable non-volatile memory). The MML 238 is configured to operate under these potential limitations of the flash memory structure 126, which may not be visible to the host. Accordingly, the MML 238 attempts to translate the writes from host into writes into the flash memory structure 126.

Controller 122 may interface with one or more memory dies 108. In one example, controller 122 and multiple memory dies 108 (e.g., together making up the storage system 100) implement an SSD, which can emulate, replace, or be used instead of a hard disk drive inside a host device, as a NAS device, or the like. Additionally, the SSD need not be made to work as a hard drive.

Figure 4A:
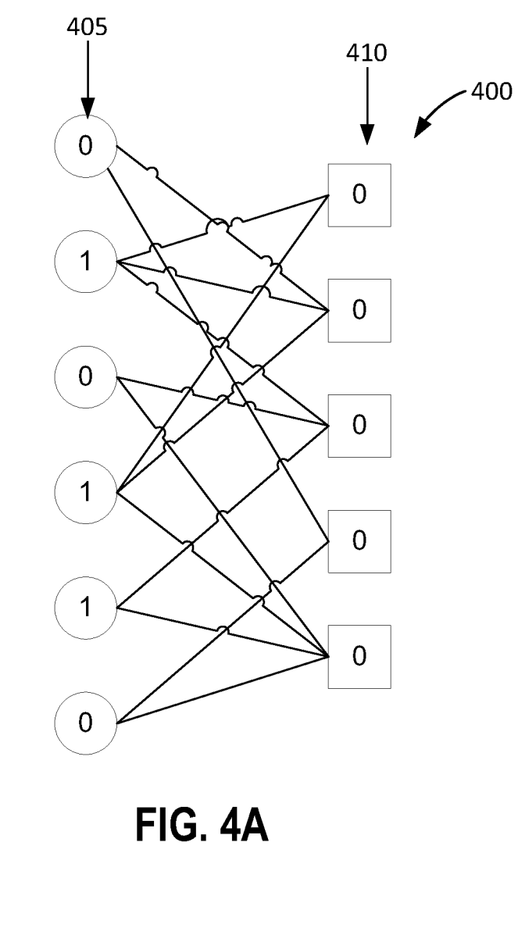
FIGS. 4A-4C illustrate a simplified version of decoding using the ULP ECC scheme in accordance with at least one example.

FIG. 4A illustrates a first state 400 of error correcting code according to at least one example. The first state 400 represents either the results of encoding or a state where there are no errors.

In FIG. 4A, a plurality of data bits 405 are shown on the left and a plurality of error code bits 410 are shown on the right. The error code bits 410 are calculated by XORing groups of the data bits 405. The XOR equations of the groups of data bits 405 are used to determine whether or not there may be errors in the data bits 405.

The first state 400 illustrates when there are no errors in the transfer or writing of memory. Prior to the transfer, the data to be transferred is encoded to generate an error correcting code (ECC) as shown on the right side. In some examples, the ECC is encoded by one or more of the ECC engine 224, the RAID module 228, and/or Flash Translation Layer (FTL) or Media Management Layer (MML) 238 (all shown in FIG. 3). The ECC is based on selecting subsets (or groups) of data bits 405 so that those bits 405 will XOR to zero and the corresponding error code bit 410 is thus zero. Accordingly, those XOR equations are transferred to the system performing the decoding. In some examples, the ECC is decoded by one or more of the ECC engine 224, the RAID module 228, and/or Flash Translation Layer (FTL) or Media Management Layer (MML) 238. In some examples, the storage bits associated with the XOR equations are set or predetermined, such as by the system or by the method of transfer. In other examples, the bits 405 associated with the XOR equations are determined around the time of the transfer.

Figure 4B:
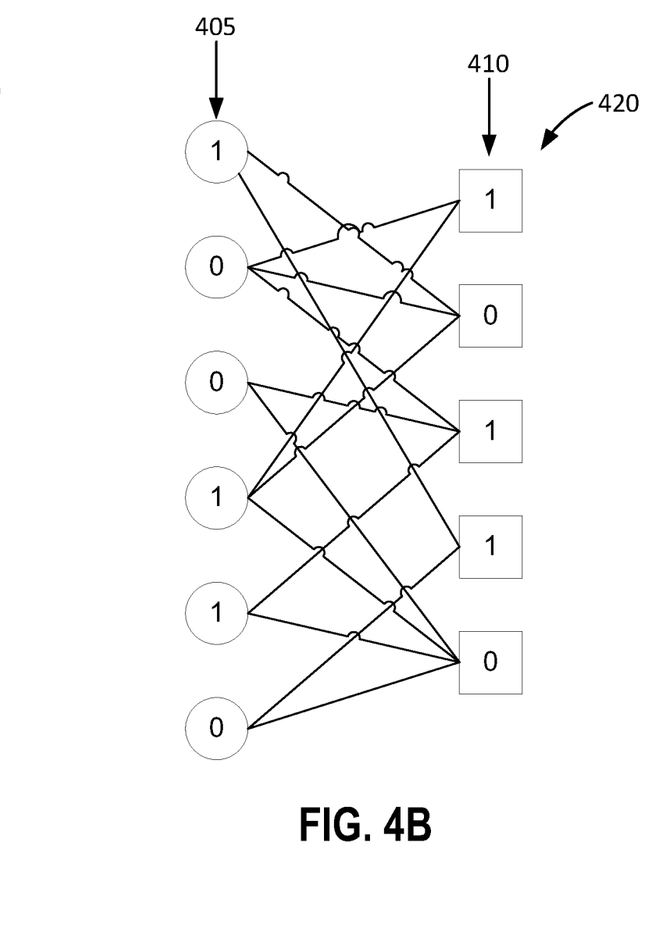

FIG. 4B illustrates a second state 420 of error correcting code according to at least one example. In contrast to the first state 400 (shown in FIG. 4A), the second state 420 includes two errors in the first and second data bits 405. These two errors have caused the first, third and fourth error code bits 410 to be set to one, while the second and fifth error code bits 410 are set to zero. In this example, the first through fourth error code bits 410 have XOR equations that include at least one of the first two data bits 405. Since the second error code bit's equation includes both of the data bits 405 that have errors, the errors cancel out and the second error code bit 410 stays at zero.

To correct this issue, the system needs to determine which data bits 405 are in error and flip them. For each of the data bits 405, a determination is made regarding how many XOR equations are unsatisfied. For the first bit 405, there are two XOR equations and only one is unsatisfied. For the second bit 405, there are three XOR equations and two are unsatisfied. For the third bit 405, there are two XOR equations and only one is unsatisfied. For the fourth bit 405, there are three XOR equations and one is unsatisfied. For the fifth and sixth bits 405, there two XOR equations each and one is unsatisfied for each.

Based on the unsatisfied equations, the second bit 405 has the highest percentage of unsatisfied XOR equations. Accordingly, the system flips the second bit 405. The system also flips the three error code bits 410 connected to the second bit 405 through XOR equations.

Figure 4C:
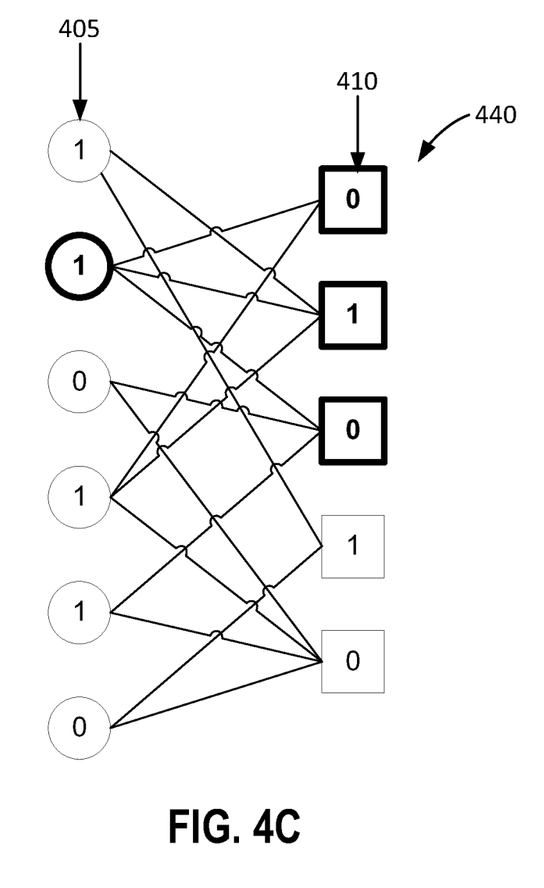

FIG. 4C illustrates a third state 440 of error correcting code according to at least one example. After the second bit 405 and its connected error code bits 410 in the second state 420 (shown in FIG. 4B) are flipped, the system reaches the third decoding state 440. At this point, the first bit 405 is still in error from the first state 400 (shown in FIG. 4A) and the two error code bits 410 connected to the first bit 405 are set to one. Since the two error code bits 410 for the first data bit 405 are set to one, the system selects the first data bit 405 and its two connected error code bits 410 to be flipped. After these bits are flipped, then the system has removed all of the errors and returned to the first state 400.

FIG. 4A-FIG. 4C illustrate a simplified version of decoding using the ULP ECC scheme for a very small sample of data bits 405 and error code bits 410. As the numbers of bits increase, so do the issues including which bit to flip next. In large systems with significant amounts of bits and multiple errors, there can be issues with determining which bit to flip next and when to stop flipping bits. In some cases, there may be loops where the system gets into a cycle of flipping the same bits over and over again. Accordingly, the systems and methods describe herein provide a reinforcement learning based system and method for decoding to be efficient and effective.

In the RL problem for decoding, each episode can be considered the decoding of one word (a sequence of bits). In each episode step, the RL agent decides the threshold for the current variables (this is the action a). The reward r for each clock is −1. The episode ends when the word is decoded successfully (SW equal to zero) or the system reaches max_clocks, a pre-defined number of clocks.

If the algorithm fails to converge, the episode ends with a failure, and a new episode will start. The LDPC engine has more complex and time consuming schemes that can be used in cases where the algorithm failed to converge for decoding when the faster ULP engine failed. In these cases, the reward is penalized with the number of clocks these algorithm ran until successful decoding.

The systems and methods recited herein quantize the state space and use lattice interpolation within the algorithm such that the new RL scheme perform generalizations. This improves the performance of sparse reward problems. The system quantizes the clock and the SW. The clock is hard (or soft) quantized into groups of variables with the same degree. The SW is soft quantized. Instead of learning a step function, the system learns a piecewise linear function (for each clock group).

This approach allows representing and constraining the learned function to be monotone. That is, the quality of a specific threshold is lower as the SW is higher as on average it will take more time to decode it successfully.

The method comprises two major steps. The first step is the formulation of the ULP thresholds which are chosen as an RL problem. The second is the way the state soft quantization and lattice interpolation are performed. This may be applied in many other sparse state RL problems.

The quantization is very important, since both the SW and the number of clocks is very high and thus the RL scheme convergence is extremely slow. However, normal quantization will create a problem in terms of reducing the ability of the algorithm to learn and generalize experience collected with one quantized value to another quantized value. Accordingly, a soft quantization and interpolation scheme is proposed that significantly improves the convergence of the learning phase (the training) and the ability to generalize the learning.

The soft quantization and lattice interpolation algorithm is performed for a plurality of SW values on lattice points adjacent to the current calculated SW during the episode performed in parallel. The soft quantization is performed by giving the two quantization points that the point lies between weights in negative proportion to the normalized distance to them. The algorithm for soft quantization is the PL1 algorithm in the paper "The Pairwise Piecewise-Linear Embedding for Efficient Non-Linear Classification", Ofir Pele, Ben Taskar, Amir Globerson, Michael Werman, ICML 2013, which is incorporated by reference. An extended d-dimensional soft quantization is presented in the paper "Interpolated Discretized Embedding of Single Vectors and Vector Pairs for Classification, Metric Learning and Distance Approximation", Ofir Pele, Yakir Ben-Aliz arXiv 2016, which is also incorporated by reference. The embedded high dimensional and sparse vector is then used as a feature vector with a linear Q learning algorithm that learns high dimensional weights vector for each quantization\lattice point. This allows the interpolation calculation performed later in the inference phase in the field, e.g. after the learning phase is completed and the desired Q(st,a) table is converged.

The proposed soft quantization and lattice interpolation algorithm method can be implemented both offline where training is performed in the lab and the converged Q(st,a) table is downloaded to the storage device during the product image download, or online, where the Q(st,a) is calculated online in the field during operation and convergence is achieved. After convergence, the full table of thresholds can be computed via the activation of the inference function (dot product of the weights vector and embedded vector) for each clock and each possible syndrome weight.

The proposed soft quantization and lattice interpolation online version has a major advantage since the quantization resolution and state span, st (Clock, SW), will be adjusted during the lifetime of the device according to the observed average BER which is typically small in the beginning of life (BOL) and grows until the end of life (EOL) and hence the Q(st,a) table can be calculated with higher resolution and more limited span in the BOL with smaller SW values and continuously modified during the lifetime to growing values of SW. Accordingly, the lattice state space can be adapted by the proposed soft quantization and lattice interpolation scheme online flavor (via online learning of the weights).

After convergence, the inference of the learned model will also use the lattice interpolation and the generalization capability of the scheme is significantly improved by the proposed interpolation scheme.

Figure 5:
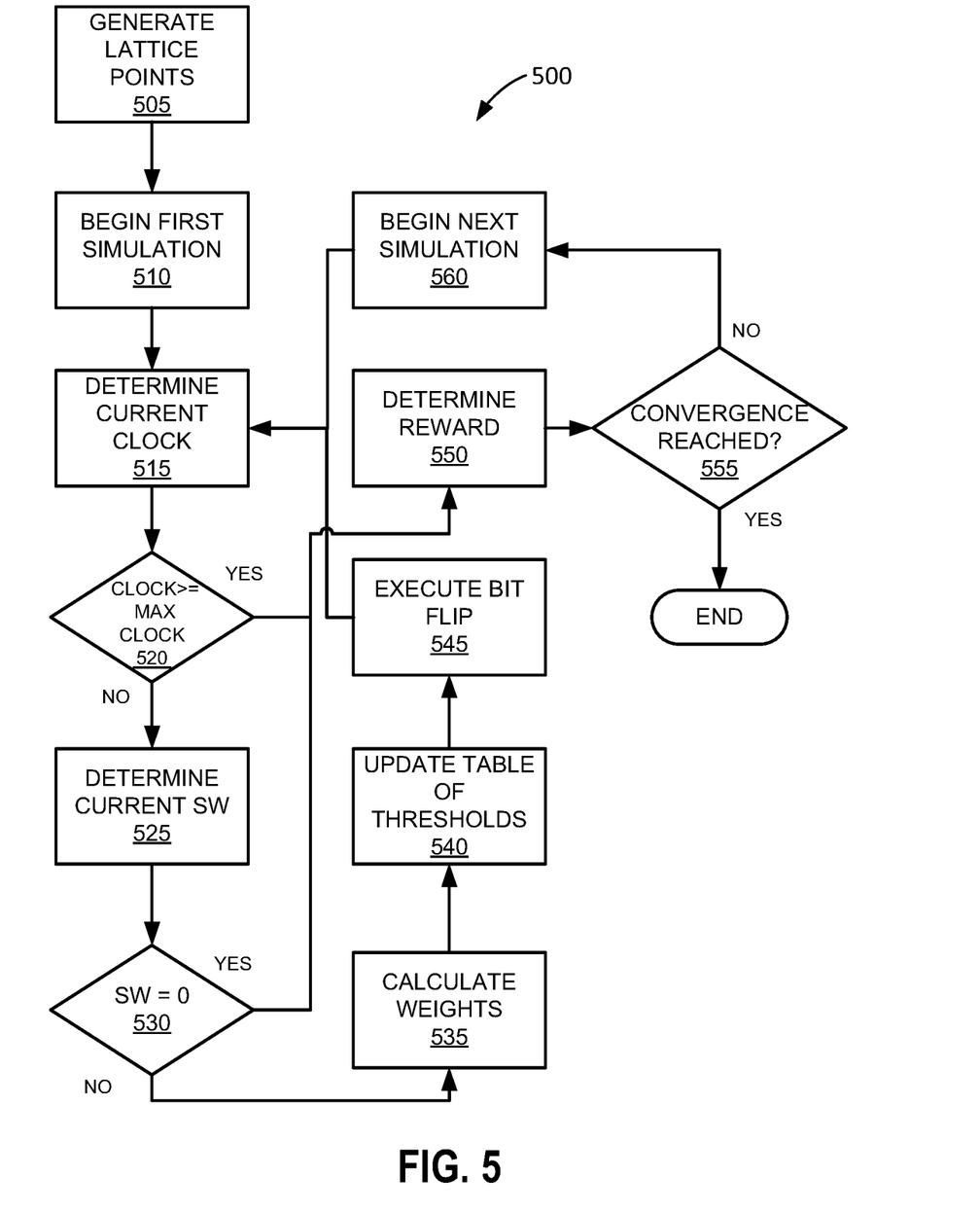
FIG. 5 illustrates a process for training a table of threshold values for use with error correcting codes in at least one example.

FIG. 5 illustrates a process 500 for training a table of threshold values for use with error correcting codes in at least one example. In an example, process 500 is performed by one or more of the ECC engine 224, the RAID module 228, and/or Flash Translation Layer (FTL) or Media Management Layer (MML) 238 (all shown in FIG. 3). In some examples, process 500 is performed offline where training is performed in the lab and the converged Q(st,a) table is downloaded to the storage device during the product image download. In other examples, process 500 is performed online, where the Q(st,a) is calculated online in the field during operation and convergence. In some examples, process 500 may be performed every time that a memory write is performed. In other examples, process 500 is performed on a periodic basis, such as, but not limited to, every day, every week, every month, every 100 memory writes, or other period of time or number of memory writes, which may be based on the expected usage amount and/or expected life of the memory being written to or from.

In some examples, in addition to the XOR equations the transmitting memory system may transmit a signal instructing the receiving memory system to update the table of thresholds online. In some examples, the system may determine to update the table of threshold values based on exceeding a threshold number of error code bits 410 in a single memory write or cumulatively based on a plurality of memory writes. For example, the system could initiate process 500 after detecting 1000 error code bits 410 over a plurality of memory writes.

In one example, the system generates 505 a plurality of lattice points as the starting point for the Q(st,a) table. The plurality of lattice points are generated relative to different SW (Syndrome Weight) values, which are the sum of all of the error code bits 410 (shown in FIG. 4). For example, the SW value for FIG. 4A is zero, the SW value for FIG. 4B is two, and the SW value for FIG. 4C is two.

The system then begins execution (510) of a first simulation episode. In an example, the training system includes a plurality of simulation episodes for decoding. In the online version, the simulation episodes may be based on past states of the storage device. The system determines (515) the current clock where each cycle of the simulation episode increased the clock by one. The system also determines (520) if the current clock is greater than or equal to the maximum clock. If the current clock is greater than or equal to the maximum clock, then the simulation episode ends and is a failure and the system determines (550) the reward (positive or negative) for the simulation episode. The system then determines (555) whether convergence has been reached. If convergence has been reached, then the method 500 is over. However, if convergence has not been reached, the method 500 begins (560) the next simulation episode.

However, if the current clock is less than the maximum clock, the system determines (525) the current SW for the simulation episode by adding together all of the error code bits (e.g., error code bits 410 (FIG. 4A)) or counting the number of error code bits that are not zero. The system then determines (530) if the SW=0. If SW=0, there are no errors indicated by the error code bits and the simulation episode is complete. The system determines (550) the reward for that simulation episode. An example of a reward function can be the number of clocks until decoding successfully (including more sophisticated algorithms clocks) multiplied by minus one. The reward could also be very low (negative) numbers for unsuccessful decoding or wrong decoding. The system may also determine (555) if convergence has been reached. If convergence has been reached, method 500 is complete. If convergence has not been reached, the method 500 begins (560) the next simulation episode.

If SW is not equal to zero, the system calculates (535) weights for the plurality of lattice points based on a plurality of distances to the current SW based on the distances between the corresponding lattice points and the current SW. The weights are calculated via a linear Q learning algorithm where the feature vector is the large but sparse embedded vector. The system updates (540) the table of thresholds based on the adjusted weights. The system may then determine which storage bit 405 (as shown in FIG. 4A-FIG. 4B) to flip next and executes (545) a bit flip where the determined data bit 405 and the connected error code bits 410 are all flipped. The clock is moved forward, and the system continues to operation 515.

In accordance with the above, examples of the present application describe a method for generating a plurality of threshold values used by an Ultra-Low Power (ULP) Low Density Parity Check (LDPC) decoder, comprising: conducting a plurality of simulations for decoding stored data; for each simulation of the plurality of simulations: determining a Syndrome Weight (SW) for a current pass of the simulation; performing lattice interpolations for a plurality of SW values on a subset of lattice points of a plurality of lattice points, the subset of lattice points adjacent to the SW for the current pass of the simulation; and generating a plurality of threshold values for the plurality of lattice points based, at least in part, on a plurality of distances between the subset of lattice points and the SW for the current pass of the simulation; and storing a table of the plurality of threshold values.

In some examples, performing lattice interpolations for the plurality of SW values comprises calculating a plurality of weights for the plurality of lattice points based, at least in part, on the plurality of distances between the subset of lattice points and the SW for the current pass of the simulation. In some example, the method also includes adjusting one or more of the plurality of threshold values using the plurality of weights. In some examples, the method also includes providing the table of the plurality of threshold values to a controller of a storage device, wherein the controller includes the ULP LDPC decoder. In some examples the plurality of threshold values provides information for determining which data bit of the stored data is to be flipped during a decoding process. In some examples, the method also includes comprising soft quantizing clock input. In some examples, the method also includes conducting the plurality of simulations using reinforcement learning to train a model for decoding the stored data. In some examples, the method also includes determining a reward for the model and the current pass of the simulation when the SW equals zero, wherein the reward is a positive reward. In some examples, the method also includes ending execution of the current pass of the simulation when a clock equals or exceeds a maximum clock. In some examples, the method also includes determining a reward for the model and the current pass of the simulation when the clock equals or exceeds the maximum clock, wherein the reward is a negative reward. In some examples, each simulation of the plurality of simulations includes a plurality of error code bits connected to a plurality of data bits in a memory, wherein the plurality of data bits are XORed together to generate the plurality of error code bits. In some examples, an error code bit of the plurality of error code bits is selected based, at least in part, on a number of unsatisfied error code bits for a data bit compared to a total number of error code bits connected to the data bit.

The present application also describes a storage device, comprising: a non-volatile memory device including a plurality of memory cells; and a controller communicatively coupled to the non-volatile memory device, the controller including an Ultra-Low Power (ULP) Low Density Parity Check (LDPC) decoder and configured to: decode data stored in the plurality of memory cells; and based on determining that the data stored in the plurality of memory cells includes an error, perform error correction code (ECC) decoding on the data using a table of threshold values, the table of threshold values identifying which data bits and corresponding error code bits of the data stored in the plurality of memory cells to flip, the table of threshold values being generated, based at least in part, on: a plurality of distances between a subset of lattice points of a plurality of lattice points and a determined Syndrome Weight (SW) associated with a pass of a simulation of a plurality of simulations in which sample data was decoded; and determined lattice interpolations for a plurality of SW values on the subset of lattice points of the plurality of lattice points associated with the pass of the simulation of the plurality of simulations in which the sample data was decoded.

In an example, the table of threshold values is further generated by: calculating weights for the plurality of lattice points based, at least in part, on the plurality of distances between the subset of lattice points and the determined SW; generating additional threshold values for the table of threshold values based, at least in part, on the calculated weights; executing the plurality of simulations until the SW equals zero; and updating the table of threshold values based on the additional threshold. In some examples, the table of threshold values is further generated by: conducting the plurality of simulations using reinforcement learning to train a model for decoding the sample data; and determining a reward for the model when the SW equals zero, wherein the reward is a positive reward. In some examples, the storage device of claim 15, wherein the table of threshold values is further generated by: ending execution of the simulation when a clock equals or exceeds a maximum clock; and determining a reward for the model when the clock equals or exceeds the maximum clock, wherein the reward is a negative reward.

The present application also describes a method for generating a plurality of threshold values used by an Ultra-Low Power (ULP) Low Density Parity Check (LDPC) decoder, comprising: conducting a plurality of simulations using reinforcement learning to train a model for decoding stored data; for each simulation of the plurality of simulations: determining a Syndrome Weight (SW) for a current pass of the simulation; performing lattice interpolations for a plurality of SW values on a subset of lattice points adjacent to the SW for the current pass of the simulation; and generating a plurality of threshold values for a plurality of lattice points based, at least in part, on a plurality of distances between the subset of lattice points and the SW for the current pass of the simulation; storing a table of the plurality of threshold values; and updating the model using the plurality of threshold values.

In an example, the method also includes providing the table of the plurality of threshold values to the ULP LDPC decoder. In an example, the method is performed in an online setting and the method further comprises: adjusting one or more threshold values of the plurality of threshold values based, at least in part, on the lattice interpolations; and updating the table of the plurality of threshold values based on the one or more adjusted threshold values. In an example, the method also includes determining a reward for the model when the SW equals zero, wherein the reward is a positive reward.

The term computer-readable media as used herein may include computer storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information, and which can be accessed by a computing device. Any such computer storage media may be part of the computing device. Computer storage media does not include a carrier wave or other propagated or modulated data signal.

Additionally, examples described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various examples.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an example with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to examples of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for generating a plurality of threshold values used by an Ultra-Low Power (ULP) Low Density Parity Check (LDPC) decoder, comprising:
   conducting a plurality of simulations for decoding stored data;
   for each simulation of the plurality of simulations:
      determining a Syndrome Weight (SW) for a current pass of the simulation;
      performing lattice interpolations for a plurality of SW values on a subset of lattice points of a plurality of lattice points, the subset of lattice points adjacent to the SW for the current pass of the simulation; and
      generating a plurality of threshold values for the plurality of lattice points based, at least in part, on a plurality of distances between the subset of lattice points and the SW for the current pass of the simulation; and
   storing a table of the plurality of threshold values.

2. The method of claim 1, wherein performing lattice interpolations for the plurality of SW values comprises calculating a plurality of weights for the plurality of lattice points based, at least in part, on the plurality of distances between the subset of lattice points and the SW for the current pass of the simulation.

3. The method of claim 2, further comprising adjusting one or more of the plurality of threshold values using the plurality of weights.

4. The method of claim 1, further comprising providing the table of the plurality of threshold values to a controller of a storage device, wherein the controller includes the ULP LDPC decoder.

5. The method of claim 1, wherein the plurality of threshold values provides information for determining which data bit of the stored data is to be flipped during a decoding process.

6. The method of claim 1, further comprising soft quantizing clock input.

7. The method of claim 1, further comprising conducting the plurality of simulations using reinforcement learning to train a model for decoding the stored data.

8. The method of claim 7, further comprising determining a reward for the model and the current pass of the simulation when the SW equals zero, wherein the reward is a positive reward.

9. The method of claim 7, further comprising ending execution of the current pass of the simulation when a clock equals or exceeds a maximum clock.

10. The method of claim 9, further comprising determining a reward for the model and the current pass of the simulation when the clock equals or exceeds the maximum clock, wherein the reward is a negative reward.

11. The method of claim 1, wherein each simulation of the plurality of simulations includes a plurality of error code bits connected to a plurality of data bits in a memory, wherein the plurality of data bits are XORed together to generate the plurality of error code bits.

12. The method of claim 11, wherein an error code bit of the plurality of error code bits is selected based, at least in part, on a number of unsatisfied error code bits for a data bit compared to a total number of error code bits connected to the data bit.

13. A storage device, comprising:
   a non-volatile memory device including a plurality of memory cells; and
   a controller communicatively coupled to the non-volatile memory device, the controller including an Ultra-Low Power (ULP) Low Density Parity Check (LDPC) decoder and configured to:
      decode data stored in the plurality of memory cells; and
      based on determining that the data stored in the plurality of memory cells includes an error, perform error correction code (ECC) decoding on the data using a table of threshold values, the table of threshold values identifying which data bits and corresponding error code bits of the data stored in the plurality of memory cells to flip, the table of threshold values being generated, based at least in part, on:
         a plurality of distances between a subset of lattice points of a plurality of lattice points and a determined Syndrome Weight (SW) associated with a pass of a simulation of a plurality of simulations in which sample data was decoded; and
         determined lattice interpolations for a plurality of SW values on the subset of lattice points of the plurality of lattice points associated with the pass of the simulation of the plurality of simulations in which the sample data was decoded.

14. The storage device of claim 13, wherein the table of threshold values is further generated by:
   calculating weights for the plurality of lattice points based, at least in part, on the plurality of distances between the subset of lattice points and the determined SW;
   generating additional threshold values for the table of threshold values based, at least in part, on the calculated weights;
   executing the plurality of simulations until the SW equals zero; and
   updating the table of threshold values based on the additional threshold.

15. The storage device of claim 13, wherein the table of threshold values is further generated by:
   conducting the plurality of simulations using reinforcement learning to train a model for decoding the sample data; and
   determining a reward for the model when the SW equals zero, wherein the reward is a positive reward.

16. The storage device of claim 15, wherein the table of threshold values is further generated by:
   ending execution of the simulation when a clock equals or exceeds a maximum clock; and
   determining a reward for the model when the clock equals or exceeds the maximum clock, wherein the reward is a negative reward.

17. A method for generating a plurality of threshold values used by an Ultra-Low Power (ULP) Low Density Parity Check (LDPC) decoder, comprising:

conducting a plurality of simulations using reinforcement learning to train a model for decoding stored data;
for each simulation of the plurality of simulations:
 determining a Syndrome Weight (SW) for a current pass of the simulation;
 performing lattice interpolations for a plurality of SW values on a subset of lattice points adjacent to the SW for the current pass of the simulation; and
 generating a plurality of threshold values for a plurality of lattice points based, at least in part, on a plurality of distances between the subset of lattice points and the SW for the current pass of the simulation;
storing a table of the plurality of threshold values; and
updating the model using the plurality of threshold values.

18. The method of claim 17, further comprising providing the table of the plurality of threshold values to the ULP LDPC decoder.

19. The method of claim 17, wherein the method is performed in an online setting and the method further comprises:
 adjusting one or more threshold values of the plurality of threshold values based, at least in part, on the lattice interpolations; and
 updating the table of the plurality of threshold values based on the one or more adjusted threshold values.

20. The method of claim 17, further comprising determining a reward for the model when the SW equals zero, wherein the reward is a positive reward.

* * * * *